(12) United States Patent
Ishigami et al.

(10) Patent No.: US 7,243,561 B2
(45) Date of Patent: Jul. 17, 2007

(54) SENSOR DEVICE

(75) Inventors: Atsushi Ishigami, Hirakata (JP); Kouji Sakai, Takarazuka (JP); Ryosuke Meshii, Suita (JP)

(73) Assignee: Matsushita Electric Works, Ltd., Osaka (JP)

( * ) Notice: Subject to any disclaimer, the term of this patent is extended or adjusted under 35 U.S.C. 154(b) by 140 days.

(21) Appl. No.: 10/531,074

(22) PCT Filed: Aug. 26, 2004

(86) PCT No.: PCT/JP2004/012270

§ 371 (c)(1),
(2), (4) Date: Apr. 12, 2005

(87) PCT Pub. No.: WO2005/019790

PCT Pub. Date: Mar. 3, 2005

(65) Prior Publication Data

US 2006/0053908 A1 Mar. 16, 2006

(30) Foreign Application Priority Data

Aug. 26, 2003 (JP) .............................. 2003-301907

(51) Int. Cl.
*G01D 21/02* (2006.01)
*G01D 11/24* (2006.01)
*G01P 1/02* (2006.01)
*G01L 19/14* (2006.01)

(52) U.S. Cl. ........................... 73/866.1; 73/511; 73/714
(58) Field of Classification Search ............... 73/866.1, 73/714, 511

See application file for complete search history.

(56) References Cited

U.S. PATENT DOCUMENTS 5,564,434 A 10/1996 Halperin et al. ............ 600/488
6,505,515 B1 1/2003 Delaporte .................... 73/714
7,155,975 B2 * 1/2007 Mitani et al. ............. 73/511 X

FOREIGN PATENT DOCUMENTS

| JP | 11-326087 | 11/1999 |
|---|---|---|
| JP | 3149957 | 3/2001 |
| JP | 2002-532721 | 10/2002 |
| WO | 00/36424 | 6/2000 |
| WO | WO 03/025587 A1 * | 3/2003 |

OTHER PUBLICATIONS

English language Abstract of JP 11-326087. 1 page.

* cited by examiner

*Primary Examiner*—Thomas P. Noland
(74) *Attorney, Agent, or Firm*—Greenblum & Bernstein, P.L.C.

(57) ABSTRACT

A sensor unit includes a pressure sensor, an acceleration sensor and a signal-processing circuit, which are disposed on the bottom surface of a lead to form a line in the longitudinal direction of the sensor unit. The pressure sensor and the acceleration sensor are disposed at respective symmetrical positions with respect to the center of the signal-processing circuit in the longitudinal direction of the sensor unit. Each of the pressure sensor and the acceleration sensor has substantially the same height dimension. The sensors, the signal-processing circuit and the lead are sealed with a molded body, in such a manner as to allow lead terminals of the lead to protrude outside the molded body. The signal-processing circuit is operable, based on a signal from the acceleration sensor, to control the ON/OFF action of the pressure sensor.

13 Claims, 8 Drawing Sheets

SENSOR DEVICE

TECHNICAL FIELD

The present invention relates to a sensor unit for measuring a plurality of physical quantities.

BACKGROUND ART

Heretofore, in a measuring system where it is required to measure a plurality of different types of physical quantities or a plurality of the same type of physical quantities different in detection range, a plurality of separately-packaged sensors have been used. In this case, the plurality of separately-packaged sensors have to be mounted on a circuit board individually. This involves the need for assuring a large space (area) for mounting these physical-quantity sensors in the circuit board, which leads to undesirable increases in size, complexity and cost of the measuring system.

As one measure against this problem, it is conceivable to incorporate a plurality of sensors into a single package. For example, the following Patent Publication 1 discloses a compound sensor unit having a pressure sensor for detecting a pressure and a temperature sensor for detecting a temperature which are incorporated into a single package.

Patent Publication 1: Japanese Patent No. 3149957 (FIG. 2)

DISCLOSURE OF INVENTION

Problems to Be Solved by Invention

A conventional compound sensor unit as disclosed, for example, in Patent Publication 1 can solve the above problem caused by mounting a plurality of sensors on a circuit board individually. However, the conventional compound sensor unit involves a problem concerning higher power consumption because it is designed to drive the pressure sensor and the temperature sensor independently. For example, a sensor-driving battery to be equipped in a measuring system is required to have a larger capacity.

In view of the above conventional problem, it is an object of the present invention to provide a sensor unit capable of reducing a space (area) required for mounting a plurality of sensors for measuring physical properties, and reducing the electric power required for driving these sensors.

Means for Solving Problems

In order to achieve the above object, the present invention provides a sensor unit including a lead, a plurality of physical-quantity sensors, a signal-processing circuit and a molded body. The lead has edges formed as lead terminals serving as input/output terminals. Each of the physical-quantity sensors is disposed relative to the lead and adapted to measure a physical quantity. The signal-processing circuit is disposed relative to the lead and adapted to process a signal from each of the physical-quantity sensors. The molded body is made of a plastic material, and formed to seal the lead, the physical-quantity sensors and the signal-processing circuit in such a manner as to allow the lead terminals to protrude outside the molded body. The signal-processing circuit is operable, based on the signal from at least one of the plurality of physical-quantity sensors, to control the ON/OFF action of the remaining physical-quantity sensors.

According to this sensor unit, as compared to the conventional measuring system where a plurality of physical-quantity sensors are mounted separately, the space (area) required for mounting the physical-quantity sensors can be reduced. In addition, the signal-processing circuit is operable, based on the signal from at least one of the physical-quantity sensors, to control the ON/OFF action of the remaining physical-quantity sensors, so that the need for constantly driving all of the physical-quantity sensors can be eliminated to achieve lower power consumption. Thus, when a battery is incorporated in the sensor unit, there is no need to use a large-size battery having a larger capacity, and thereby the battery can be reduced in size.

In one embodiment of the present invention, the plurality of physical-quantity sensors include a pressure sensor and an acceleration sensor. In this case, the molded body is formed with a through-hole extending upward from a pressure-receiving portion of the pressure sensor and having an opening to the outside of the molded body. This through-hole defines a pressure-introducing passage which allows fluid communication between the outside of the molded body and the pressure-receiving portion. Alternatively, the plurality of physical-quantity sensors may include an acceleration sensor and a rotational-angular-velocity sensor.

In the sensor unit including the pressure sensor and the acceleration sensor (hereinafter referred to as "pressure/acceleration sensor"), it is preferable that the pressure sensor, the acceleration sensor and the signal-processing circuit are disposed to form a line in the longitudinal direction of the sensor unit. In this case, the pressure sensor and the acceleration sensor may be disposed at respective symmetrical positions with respect to the center of the signal-processing circuit in the longitudinal direction of the sensor unit. Further, each of the pressure sensor and the acceleration sensor may have substantially the same height dimension. According to this pressure/acceleration sensor, the respective thicknesses of the molded body on the underside of the pressure sensor and on the underside of the acceleration sensor are substantially equalized so that respective stresses on the longitudinal opposite ends of the sensor unit are balanced. This provides enhanced measurement accuracy.

Preferably, the pressure/acceleration sensor includes a flexible resin interposed between the acceleration sensor and the molded body. The resin can suppress the deformation of the acceleration sensor to provide enhanced measurement accuracy.

In the pressure/acceleration sensor, the pressure-introducing passage may include a plurality of small-diameter channels. This can prevent foreign matter, such as foreign particles or dust, from getting into the pressure sensor. In addition, even if an excessive pressure is introduced into the through-hole, the channels can reduce the shock due to the pressure to prevent breakage of the pressure sensor.

In the pressure/acceleration sensor, the molded body may be integrally formed with a tubular portion extending continuously from the edge of the opening of the through-hole to the outside of the molded body and having substantially the same inner diameter as that of the through-hole. For example, when the entire circuit board having the sensor unit mounted thereon is sealed with silicone resin or the like to provide a moisture resistance thereto, the tubular portion can prevent the silicone resin or the like from getting into the pressure-introducing passage. The tubular portion can also prevent foreign matter, such as foreign particles or dust, from getting into the pressure-introducing passage.

In the sensor unit of the present invention, each of the plurality of physical-quantity sensors may have substantially the same height dimension. In this case, it is preferable that the molded body has a first portion extending between each of the physical-quantity sensors and an outer surface of the molded body on the side of the physical quantity sensor and a second portion extending between the lead and an outer surface of the molded body on the side of the lead, wherein each of the first and second portions has substantially the same thickness dimension. This can reduce a thermal stress caused by the difference in linear expansion coefficient between each of the physical-quantity sensors and the molded body made of a plastic material, to achieve a reduced temperature dependence of the sensor unit.

In the sensor unit of the present invention, the molded body may have a first portion covering the top-surface side of the lead and a second portion covering the bottom-surface side of the lead, and the first and second portions may be formed to have different tapered shapes from one another so as to allow the respective volumes of the first and second portions to be substantially equalized. This can reduce a thermal stress caused by the difference in linear expansion coefficient between the lead and the molded body made of a plastic material, to achieve a reduced temperature dependence of the sensor unit.

In the sensor unit of the present invention, at least one of the plurality of physical-quantity sensors and the signal-processing circuit may be disposed, respectively, on the top and bottom surfaces of the lead in such a manner as to sandwich the lead therebetween. This allows the sensor unit to be reduced in size. In addition, the lead made of metal, such as iron-nickel alloy, is interposed between ICs of the signal-processing circuit and the physical-quantity sensor. Thus, the lead can prevent the physical-quantity sensor from being adversely affected by noises generated from the signal-processing circuit.

EXPLANATION OF NUMERALS

Figure 1:
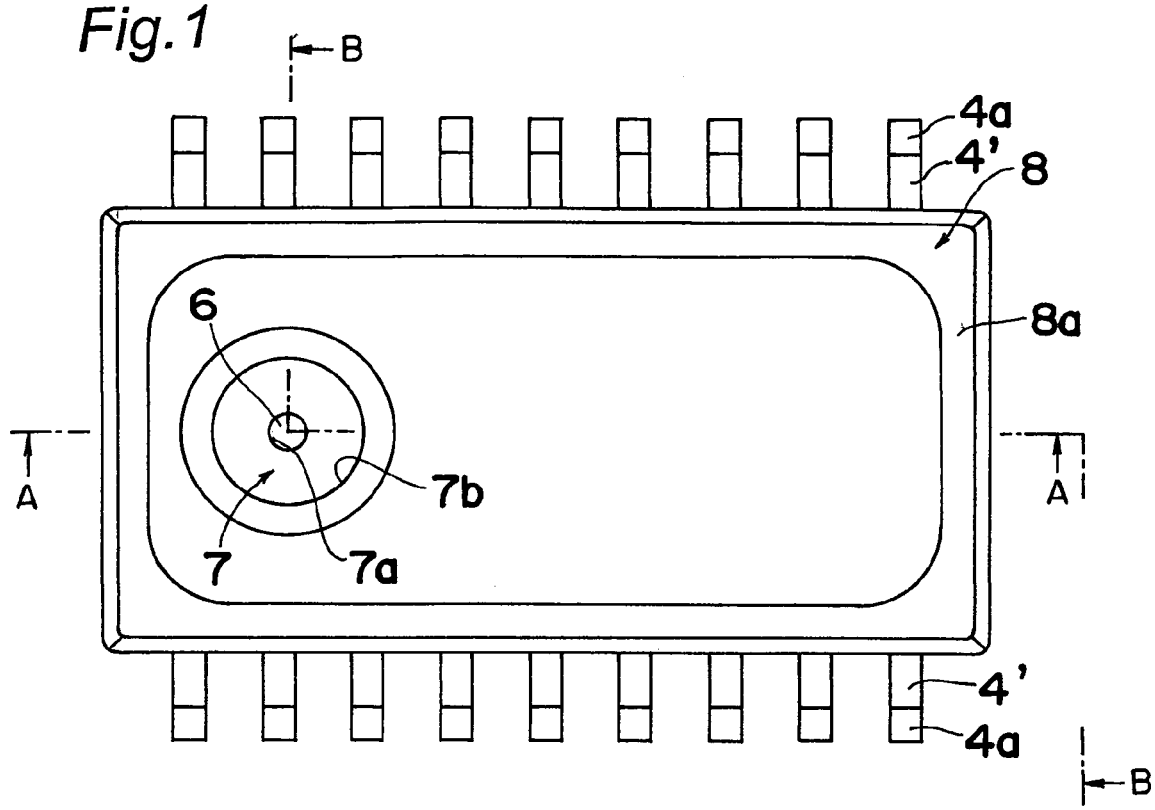
FIG. 1 is a top plan view of a sensor unit according to a first embodiment of the present invention.

1: pressure sensor, 2: acceleration sensor, 3: signal-processing circuit, 4: lead, A': lead, 4a: lead terminal; 4a': dummy lead terminal, 5: wire, 6: pressure-receiving portion, 7: pressure-introducing passage, 7a: opening, 7b: through-hole, 8: molded body, 8a: upper molded body, 8b: lower molded body, 9: pressure-sensor mounting portion, 10: acceleration-sensor mounting portion, 11: signal-processing-circuit mounting portion, 12: tubular portion, 13: circuit board, 14: device mounting portion, 15: silicone resin.

BEST MODE FOR CARRYING OUT THE INVENTION

This application is based upon and claims priority to Japanese Patent Application No. 2003-301907, the entire contents of which are incorporated herein by reference.

With reference to the accompanying drawings, various specific embodiments of the present invention will now be described. In the accompanying drawings, a common component is defined by the same reference numeral.

FIRST EMBODIMENT

Figure 2:
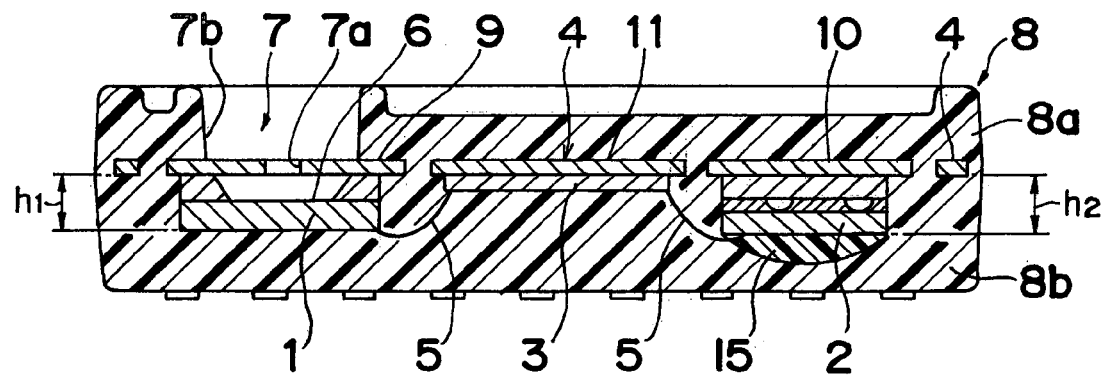
FIG. 2 is a sectional view of the sensor unit in FIG. 1, taken along the line A-A.
Figure 3:
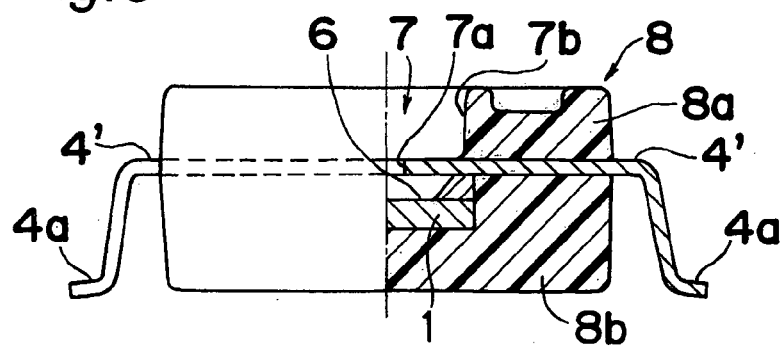
FIG. 3 is a partial sectional view of the sensor unit in FIG. 1, taken along the line B-B.

As shown in FIGS. 1 to 3, a sensor unit of the present invention may be used, for example, as a tire-air-pressure sensor. A sensor unit according to a first embodiment of the present invention includes a pressure sensor 1, an acceleration sensor 2 and a signal-processing circuit (signal processing IC) 3. The signal-processing circuit 3 is operable, only when the acceleration sensor 2 detects acceleration, to activate the pressure sensor 1. Each of the pressure sensor 1, the acceleration sensor 2 and the signal-processing circuit 3 is mounted on the bottom surface of a lead 4. The signal-processing circuit 3 is wire-bonded or electrically connected to each of the pressure sensor 1 and the acceleration sensor 2 through a plurality of bonding wires 5.

A portion of the lead 4 mounting the pressure sensor 1 is formed with one opening 7a for transmitting an external pressure to a pressure-receiving portion 6 formed in the pressure sensor 1. The pressure-receiving portion 6 is composed, for example, of a diaphragm, and operable to detect a pressure. The lead 4 is covered and sealed with a molded body 8 made of a plastic material, in such a manner as to allow a plurality of lead terminals 4a to protrude outside the molded body 8. The molded body 8 consists of an upper molded body 8a located on the side of the top surface of the lead 4, and a lower molded body 8b located on the side of the bottom surface of the lead 4.

The upper molded body 8a has a through-hole 7b for allowing the opening 7a to be exposed to the outside of the molded body 8. The opening 7a and the through-hole 7b are in fluid communication with one another to define a pressure-introducing passage 7 for transmitting an external pressure to the pressure-receiving portion 6. Further, a flexible silicone resin 15 is disposed between the bottom surface of the acceleration sensor 2 and the lower molded body 8b. This silicone resin 15 suppresses the deformation of the acceleration sensor 2 due to pressure.

Figure 4:
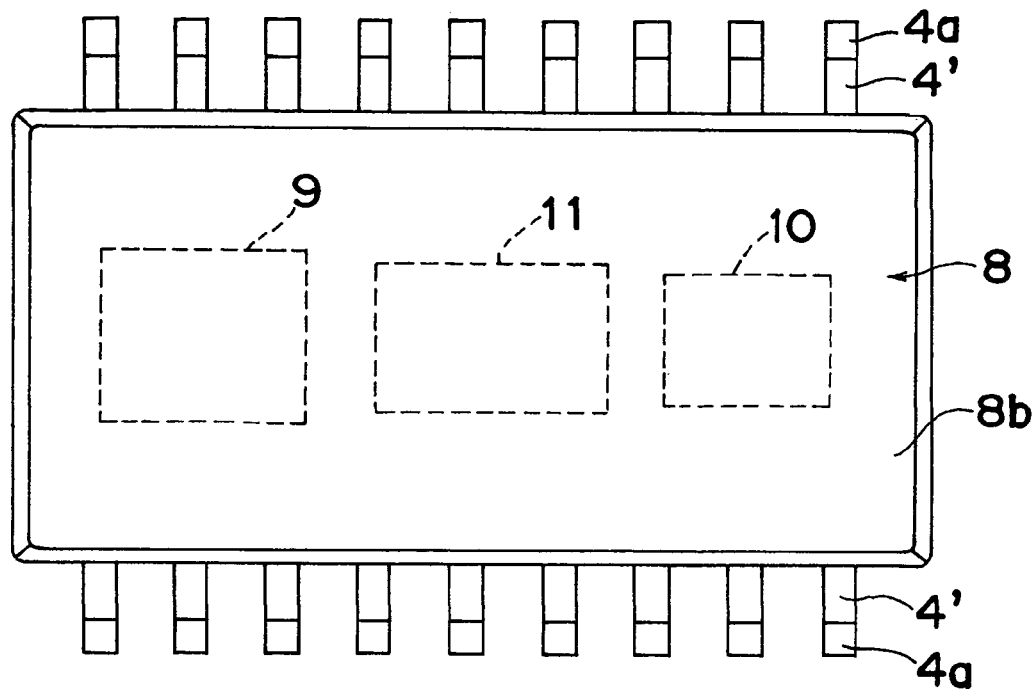
FIG. 4 is a bottom view of the sensor unit in FIG. 1.
Figure 5:
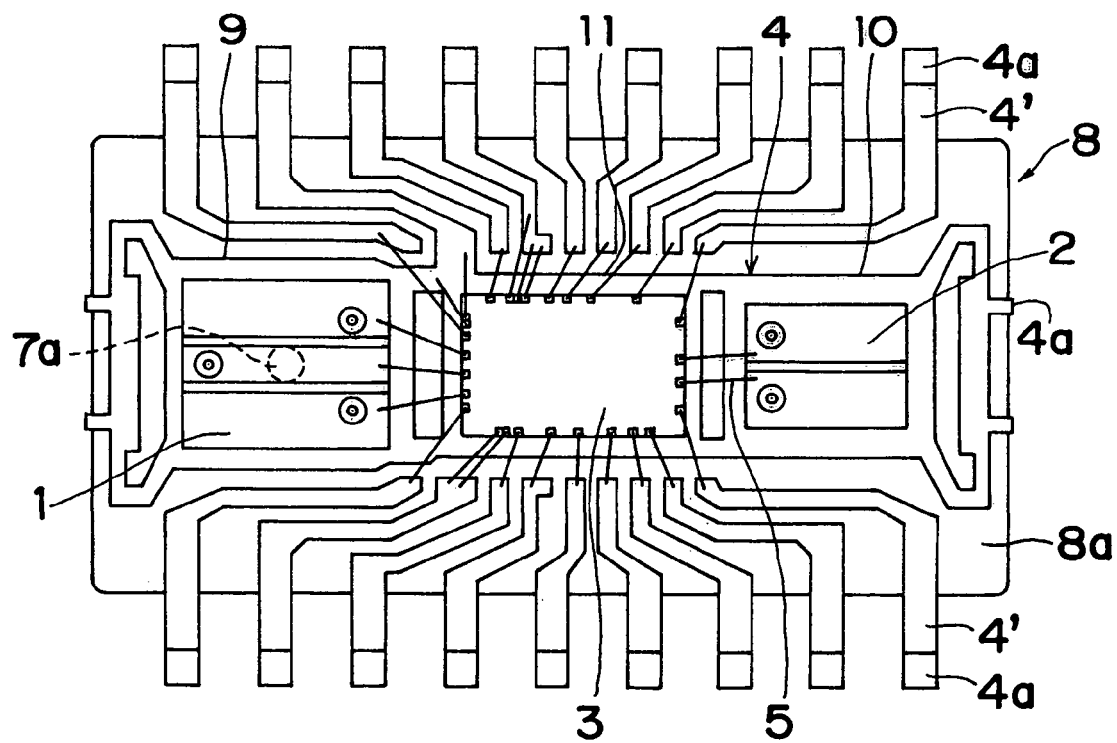
FIG. 5 is a bottom view showing an internal wiring of the sensor unit in FIG. 1, wherein a lower molded body is removed therefrom.

As shown in FIGS. 4 and 5, the lead 4 is prepared by cutting and removing a part of a lead frame made of metal, such as iron-nickel alloy. The lead 4 has a rectangular-shaped pressure-sensor mounting portion 9 for mounting the pressure sensor 1, a rectangular-shaped acceleration-sensor mounting portion 10 for mounting the acceleration sensor 2, a rectangular-shaped signal-processing circuit mounting portion 11 for mounting the signal-processing circuit 3, and the lead terminals 4a. The pressure-sensor mounting portion 9, the signal-processing circuit mounting portion 11 and the acceleration-sensor mounting portion 10 are integrally formed as a single piece in such a manner that they are disposed to form a line in the longitudinal direction of the sensor unit (right-left direction in FIGS. 4 and 5). Each of the pressure-sensor mounting portion 9 and the acceleration-sensor mounting portion 10 is integrally formed with two or more of the lead terminals 4a which protrude outward in the lengthwise (longitudinal) direction of the sensor unit. The sensor unit is also provided with a plurality of leads 4' which are formed separately from the lead 4 and electrically connected or wire-bonded to the signal-processing circuit 3 through bonding wires 5. Each of the leads 41 has a lead terminal 4a. The lead terminals 4a of the leads 4' protrude from the molded body 8 parallel to each other in the crosswise direction of the sensor unit (a direction perpendicular to the longitudinal direction of the sensor unit).

As seen in FIGS. 2 and 5, the pressure-sensor mounting portion 9, the signal-processing circuit mounting portion 11 and the acceleration-sensor mounting portion 10 are disposed to form a line in the longitudinal direction of the sensor unit. Further, in the positional relationship in the longitudinal direction of the sensor unit, the pressure-sensor mounting portion 9 and the acceleration-sensor mounting portion 10 are disposed at respective symmetrical positions with respect to the center of the signal-processing circuit mounting portion 11. Furthermore, the height dimension or thickness $h_1$ of the pressure sensor 1 is set to be substantially equal to the height dimension or thickness $h_2$ of the acceleration sensor 2. In this sensor unit, both the pressure sensor 1 and the acceleration sensor 2 are mounted on the bottom surface of the lead 4, and thereby the respective bottom surfaces of these sensors 1, 2 are located at substantially the same height position. This allows the respective thicknesses of the lower molded body 8b on the underside of the pressure sensor 1 and on the underside of the acceleration sensor 2 to be substantially equalized. Thus, respective stresses on the longitudinal opposite ends of the sensor unit can be balanced.

In the sensor unit according to the first embodiment, the pressure sensor 1 and the acceleration sensor 2 are integrally mounted on the lead 4, and sealed with the molded body 8. Thus, as compared to cases where the pressure sensor 1 and the acceleration sensor 2 are mounted on a circuit board individually, a required mounting space (area) on a circuit board can be reduced. In addition, the signal-processing circuit 3 operable to control the ON/OFF action of the pressure sensor 1 in response to a signal from the acceleration sensor 2 can achieve lower power consumption. Thus, when a battery is incorporated in the sensor unit, the battery can be reduced in size. Furthermore, the deformation of the acceleration sensor 2 is suppressed by the silicone resin 15, and the respective stresses on the longitudinal opposite ends of the sensor unit is balanced, so that the measurement accuracy of the sensor unit can be drastically improved.

SECOND EMBODIMENT

Figure 6:
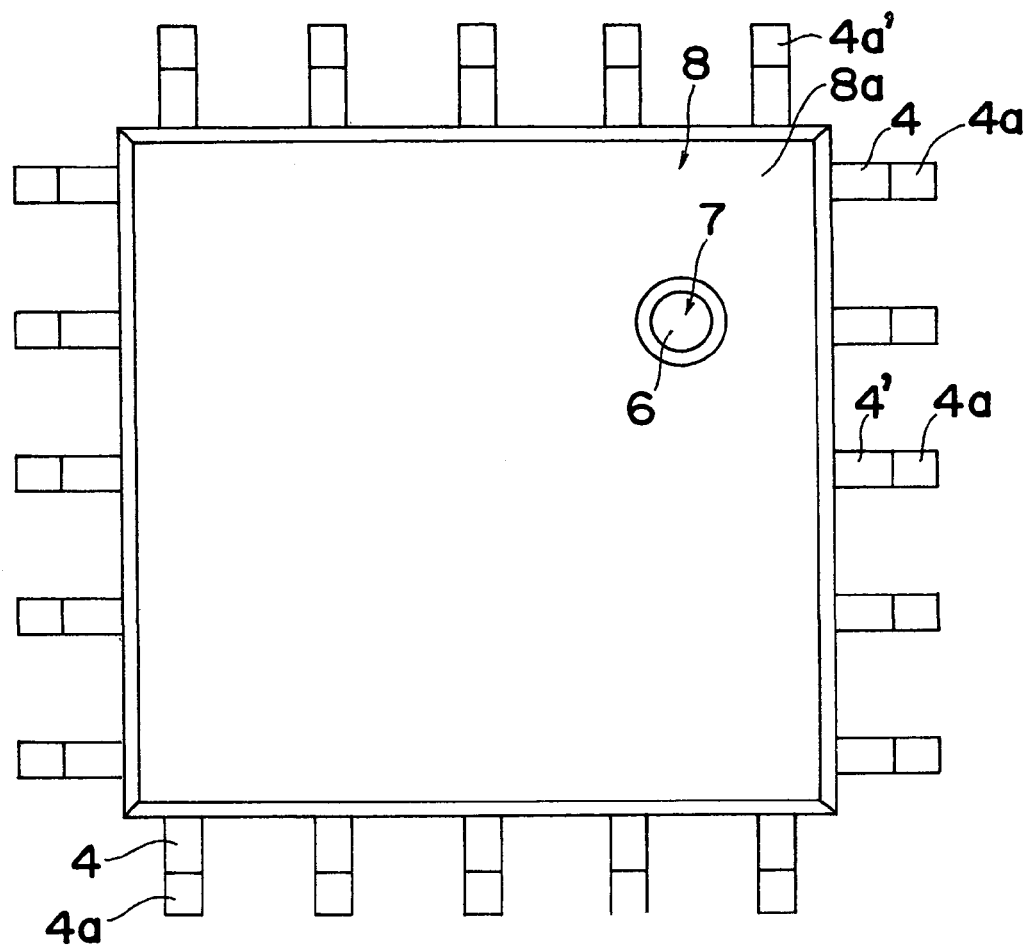
FIG. 6 is a top plan view of a sensor unit according to a second embodiment of the present invention.
Figure 7:
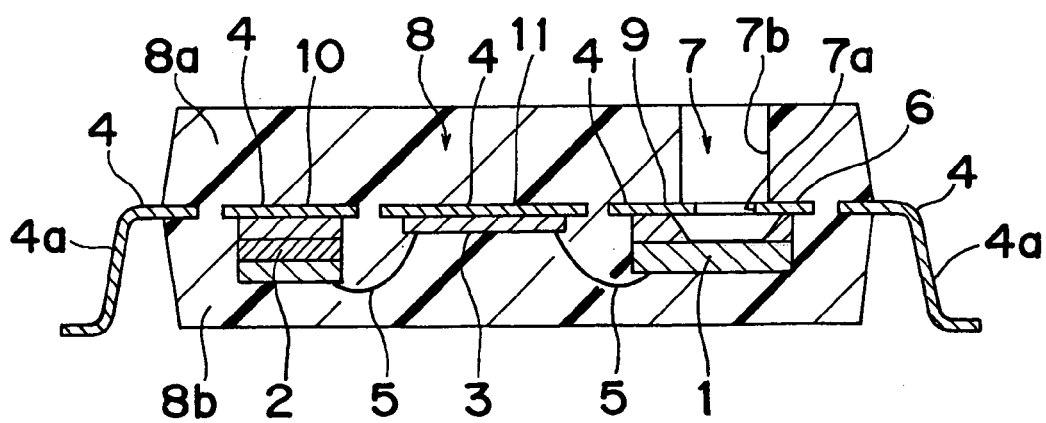
FIG. 7 is a vertical sectional view of the sensor unit in FIG. 6.
Figure 8:
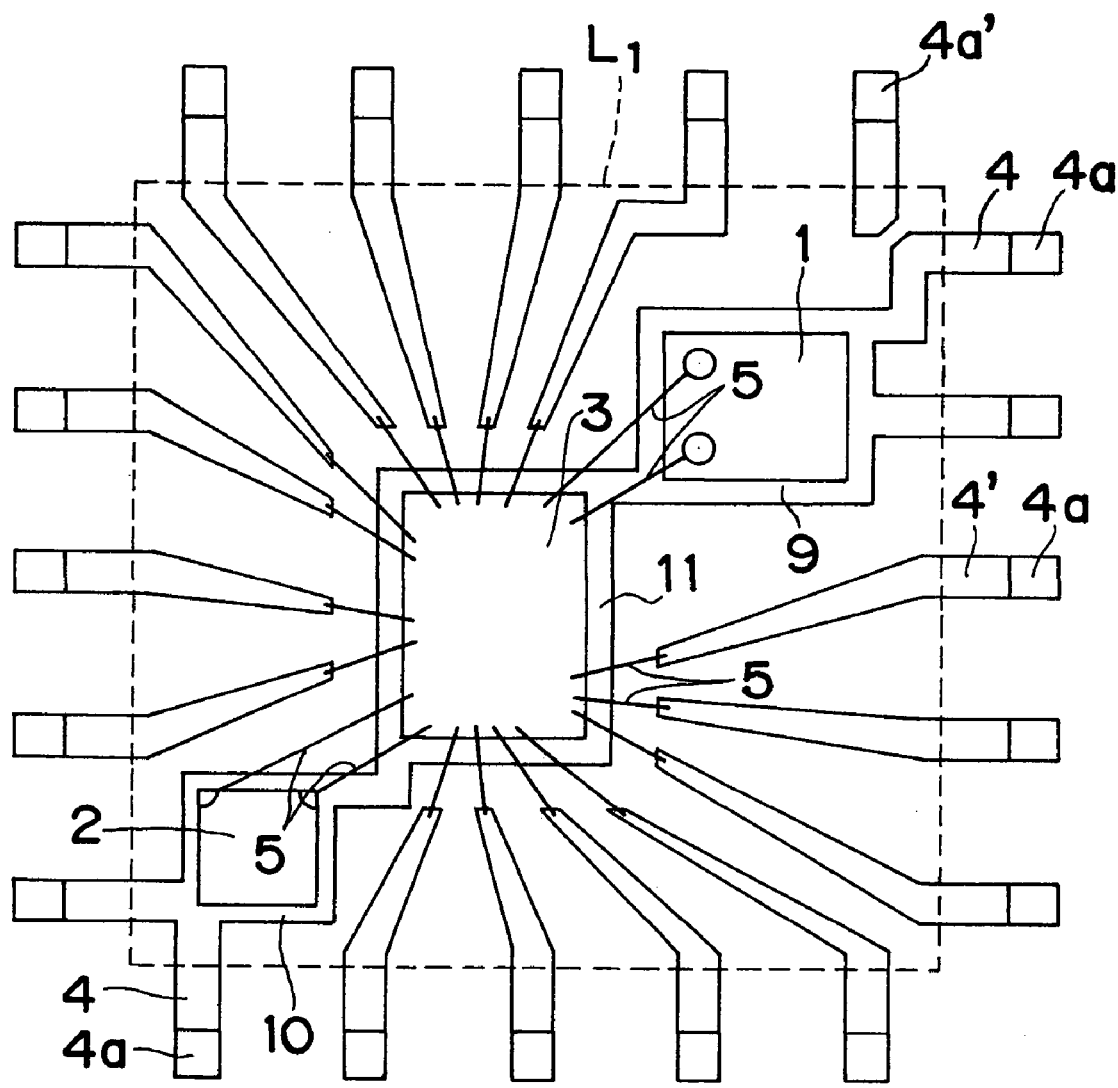
FIG. 8 is a bottom view showing an internal wiring of the sensor unit in FIG. 6, wherein a molded body is removed therefrom.

With reference to FIGS. 6 to 8, a second embodiment of the present invention will be specifically described below. As shown in FIGS. 6 and 7, a sensor unit according to the second embodiment includes a pressure sensor 1, an acceleration sensor 2, and a signal-processing circuit (signal processing IC) 3 having a function designed to activate the pressure sensor 1 only when the acceleration sensor 2 detects acceleration. Each of the pressure sensor 1, the acceleration sensor 2 and the signal-processing circuit 3 is mounted on the bottom surface of a lead 4. The signal-processing circuit 3 is wire-bonded or electrically connected to each of the pressure sensor 1 and the acceleration sensor 2 through two bonding wires 5. A portion of the lead 4 mounting the pressure sensor 1 is formed with one opening 7a for transmitting an external pressure to a pressure-receiving portion 6 formed in the pressure sensor 1. The pressure-receiving portion 6 is composed, for example, of a diaphragm, and operable to detect a pressure.

The lead 4 is covered and sealed with a molded body 8 made of a plastic material, in such a manner as to allow a plurality of lead terminals 4a to protrude outside the molded body 8. The molded body 8 consists of an upper molded body 8a located on the side of the top surface of the lead 4, and a lower molded body 8b located on the side of the bottom surface of the lead 4. The upper molded body 8a has a through-hole 7b for allowing the opening 7a to be exposed to the outside of the molded body 8. The opening 7a and the through-hole 7b are in fluid communication with one another to define a pressure-introducing passage 7. An external pressure is transmitted to the pressure-receiving portion 6 through the pressure-introducing passage 7.

FIG. 8 shows the sensor unit in the state before the lead 4 is sealed with the molded body 8. The dotted line $L_1$ in FIG. 8 indicates a region in which the molded body 8 is to be formed. The lead 4 is prepared by cutting and removing a part of a lead frame made of metal, such as iron-nickel alloy. The lead 4 has a rectangular-shaped pressure-sensor mounting portion 9 for mounting the pressure sensor 1, a rectangular-shaped acceleration-sensor mounting portion 10 for mounting the acceleration sensor 2, a rectangular-shaped signal-processing-circuit mounting portion 11 for mounting the signal-processing circuit 3, and the lead terminals 4a. The lead 4 is integrally formed as a single piece in such a manner that one of two diagonally-opposed corners of the signal-processing circuit mounting portion 11 is joined to one corner of the pressure-sensor mounting portion 9, and the other corner of the signal-processing-circuit mounting portion 11 is joined to one corner of the acceleration-sensor mounting portion 10. Each of the outer corners of the pressure-sensor mounting portion 9 and the acceleration-sensor mounting portion 10 is integrally formed with the lead terminals 4a protruding outward.

The sensor unit is also provided with a plurality of leads 4' which are formed separately from the lead 4. These leads 4' are electrically connected or wire-bonded to the signal-processing circuit 3 through bonding wires 5. The leads 4' are disposed to extend outward from the vicinity of the outer periphery of the signal-processing circuit 3 in a radial pattern. Lead terminals 4a of the leads 4' protrude outward from the molded body 8 parallel to each other in the lengthwise and crosswise directions of the sensor unit. The lead terminals protruding from the molded body 8 are used as input/output terminals. Further, the molded body 8 is provided with one dummy lead terminal 4a' having no function.

In the sensor unit according to the second embodiment, the pressure sensor 1 and the acceleration sensor 2 are integrally mounted on the lead 4, and sealed with the molded body 8. Thus, as compared to cases where the pressure sensor 1 and the acceleration sensor 2 are mounted on a circuit board individually, a required mounting area on a circuit board can be reduced. In addition, the signal-processing circuit 3 operable to control the ON/OFF action of the pressure sensor 1 in response to a signal from the acceleration sensor 2 can achieve lower power consumption. Thus, when a battery is incorporated in the sensor unit, the battery can be reduced in size.

While the sensor unit according to the second embodiment employs a combination of a pressure sensor and an acceleration sensor, any other combination of sensors may be used. For example, an acceleration sensor and a rotational-angular-velocity sensor may be combined, and the signal-processing circuit may be designed to activate the acceleration sensor only when the rotational-angular-velocity sensor detects rotational angular velocity. This sensor unit can be used, for example, in a vehicle, such as automobile, to detect a lateral acceleration relative to a traveling direction only when a steering wheel is turned to change the traveling direction. It is to be understood that any other physical-quantity sensor may be additionally incorporated in the sensor unit within the spirit and scope of the present invention.

THIRD EMBODIMENT

Figure 9:
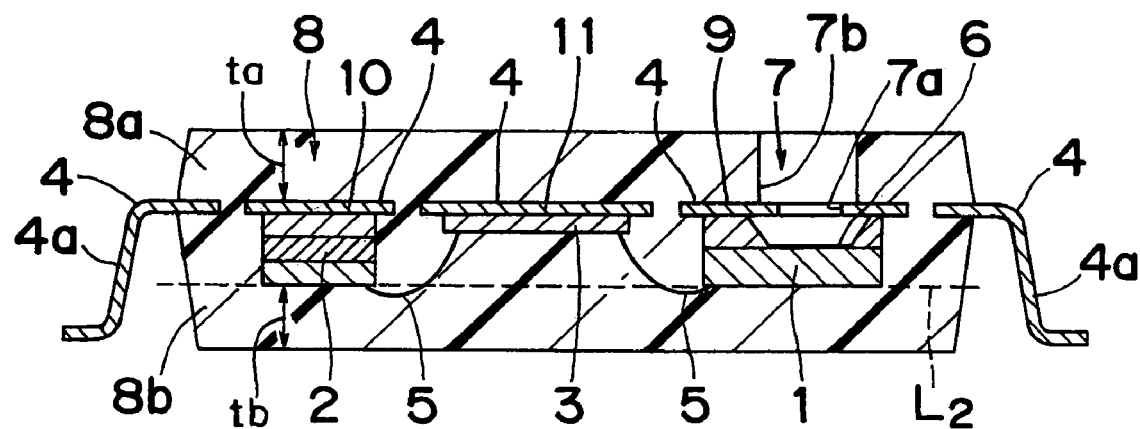
FIG. 9 is a vertical sectional view of a sensor unit according to a third embodiment of the present invention.

With reference to FIG. 9, a third embodiment of the present invention will be specifically described below. As shown in FIG. 9, a sensor unit according to the third embodiment, each of a pressure sensor 1 and an acceleration sensor 2 has substantially the same height dimension or thickness. That is, the respective bottom surfaces of the pressure sensor 1 and the acceleration sensor 2 are located at substantially the same height position indicated by the dotted line $L_2$. Further, an upper molded body 8a and a lower molded body 8b are formed such that the height dimension ta (thickness) between the top surface of the upper molded body 8a and the top surface of a lead 4 becomes substantially equal to the height dimension tb (thickness) between the bottom surface of the lower molded body 8b and each of the bottom surfaces of the pressure sensor 1 and the acceleration sensor 2. The remaining structures are the same as those in the second embodiment, and their description will be omitted.

In the sensor unit according to the third embodiment, each of the pressure sensor 1 and the acceleration sensor 2 has substantially the same thickness, and the respective thicknesses of the molded body 8 on the top-surface side and the bottom-surface side thereof are substantially equalized at the positions corresponding to the pressure sensor 1 and the acceleration sensor 2. This can reduce a thermal stress caused by the difference in linear expansion coefficient between each physical-quantity sensor (sensor element), such as the pressure sensor 1 and the acceleration sensor 2, and the molded body 8 made of a plastic material, to achieve a reduced temperature dependence of the sensor unit. The above characteristic structure in the sensor unit according to the third embodiment may be applied to each of the aforementioned first and second embodiments and after-mentioned fourth to eighth embodiments.

FOURTH EMBODIMENT

Figure 10:
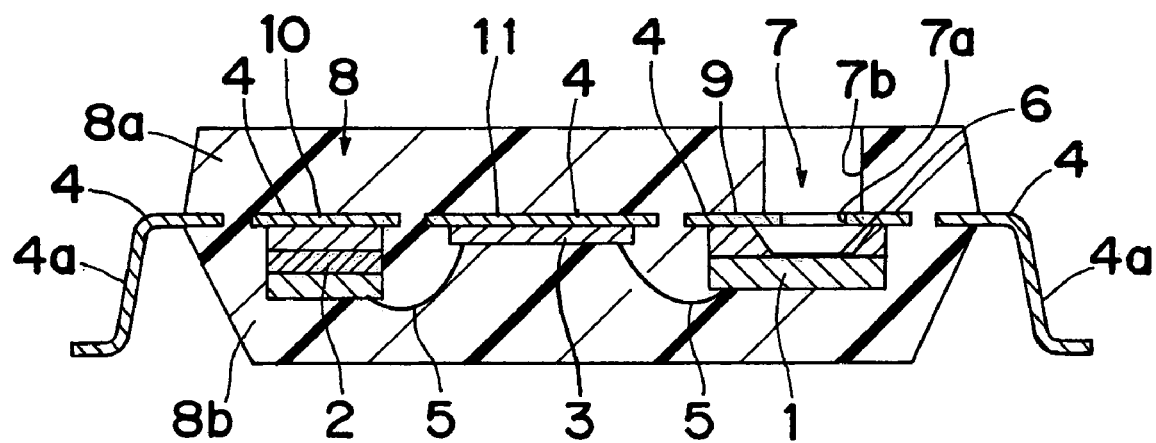
FIG. 10 is a sectional view of a sensor unit according to a fourth embodiment of the present invention.

With reference to FIG. 10, a fourth embodiment of the present invention will be specifically described below. In a sensor unit according to the fourth embodiment, a molded body 8 consists of an upper molded body 8a located on the upper side relative to a lead 4 and a lower molded body 8b located on the lower side relative to the lead 4, and the upper molded body 8a and the lower molded body 8b are formed to have different tapered shapes from one another so as to allow the respective volumes of the upper and lower molded bodies 8a, 8b to be substantially equalized. The remaining structures are the same as those in the second embodiment, and their description will be omitted.

In a sensor unit according to the fourth embodiment, each of the upper molded body 8a and the lower molded body 8b has substantially the same volume. This can reduce a thermal stress caused by the difference in linear expansion coefficient between a metal material, such as iron-nickel alloy, constituting the lead 4, and a plastic material constituting the molded body 8, to achieve a reduced temperature dependence of the sensor unit. The above characteristic structure in the sensor unit according to the fourth embodiment may be applied to each of the aforementioned first to third embodiments and after-mentioned fifth to eighth embodiments.

FIFTH EMBODIMENT

Figure 11:
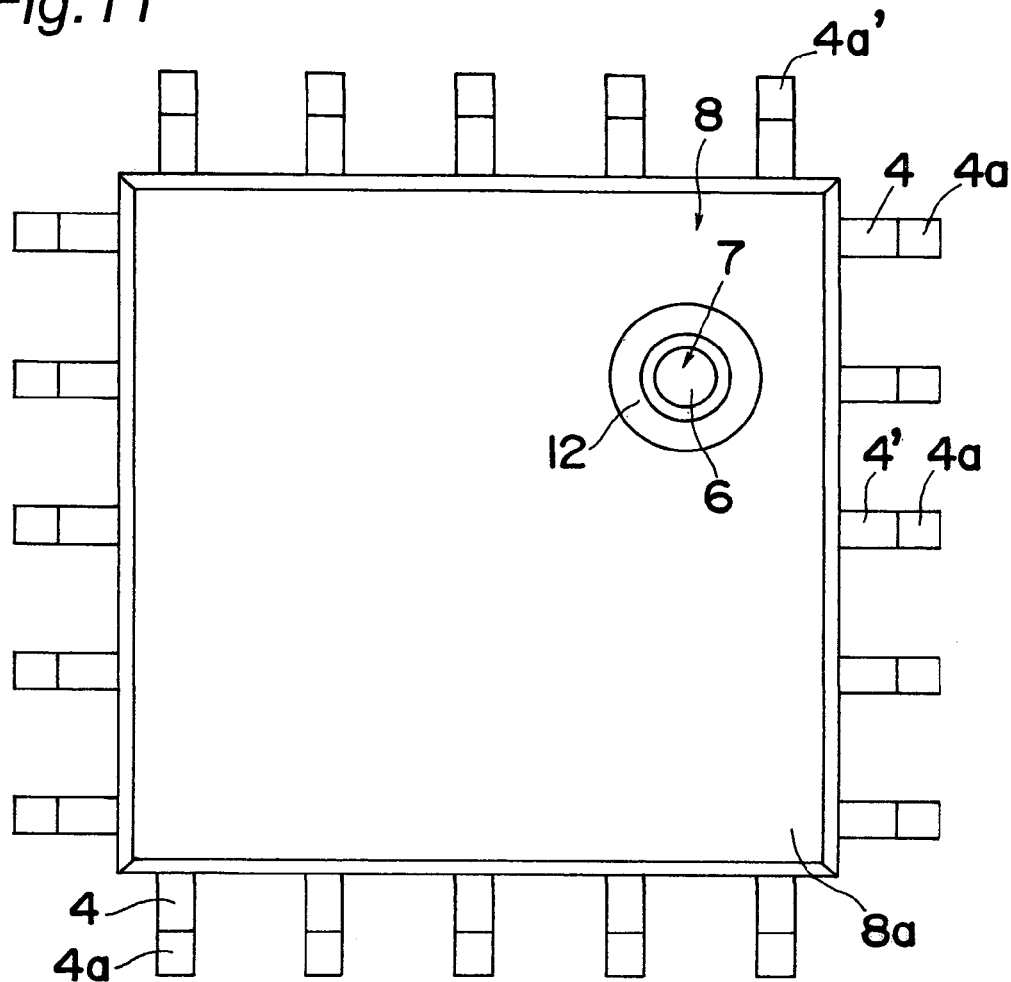
FIG. 11 is a top plan view of a sensor unit according to a fifth embodiment of the present invention.
Figure 12:
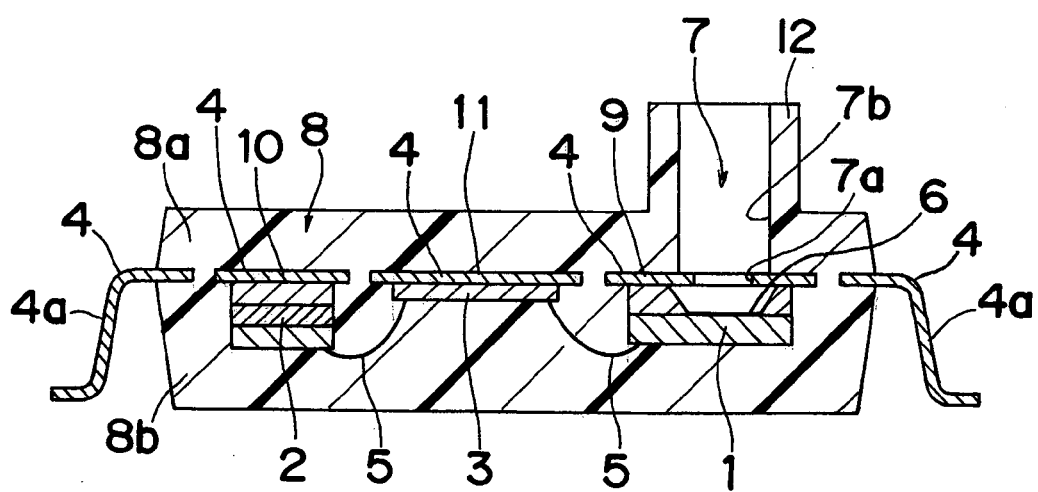
FIG. 12 is a vertical sectional view of the sensor unit in FIG. 11.

With reference to FIGS. 11 and 12, a fifth embodiment of the present invention will be specifically described below. As shown in FIGS. 11 and 12, in a sensor unit according to the fifth embodiment, a tubular portion 12 having substantially the same inner diameter as that of a through-hole 7b, or a tubular protrusion, is integrally formed in a molded body 8 through a molding method in such a manner as to extend a pressure-introducing passage 7. The remaining structures are the same as those in the second embodiment, and their description will be omitted.

In the sensor unit according to the fifth embodiment, the tubular portion 12 is integrally formed with the molded body 8 to extend the pressure-introducing passage 7. Thus, for example, when a circuit board having the sensor unit mounted thereon is entirely sealed with silicone resin or the like to provide a moisture resistance thereto, the tubular portion 12 can prevent the silicone resin or the like from getting into the pressure-introducing passage 7. The tubular portion 12 can also prevent foreign matter, such as foreign particles or dusts, from getting into the pressure-introducing passage 7.

SIXTH EMBODIMENT

Figure 13:
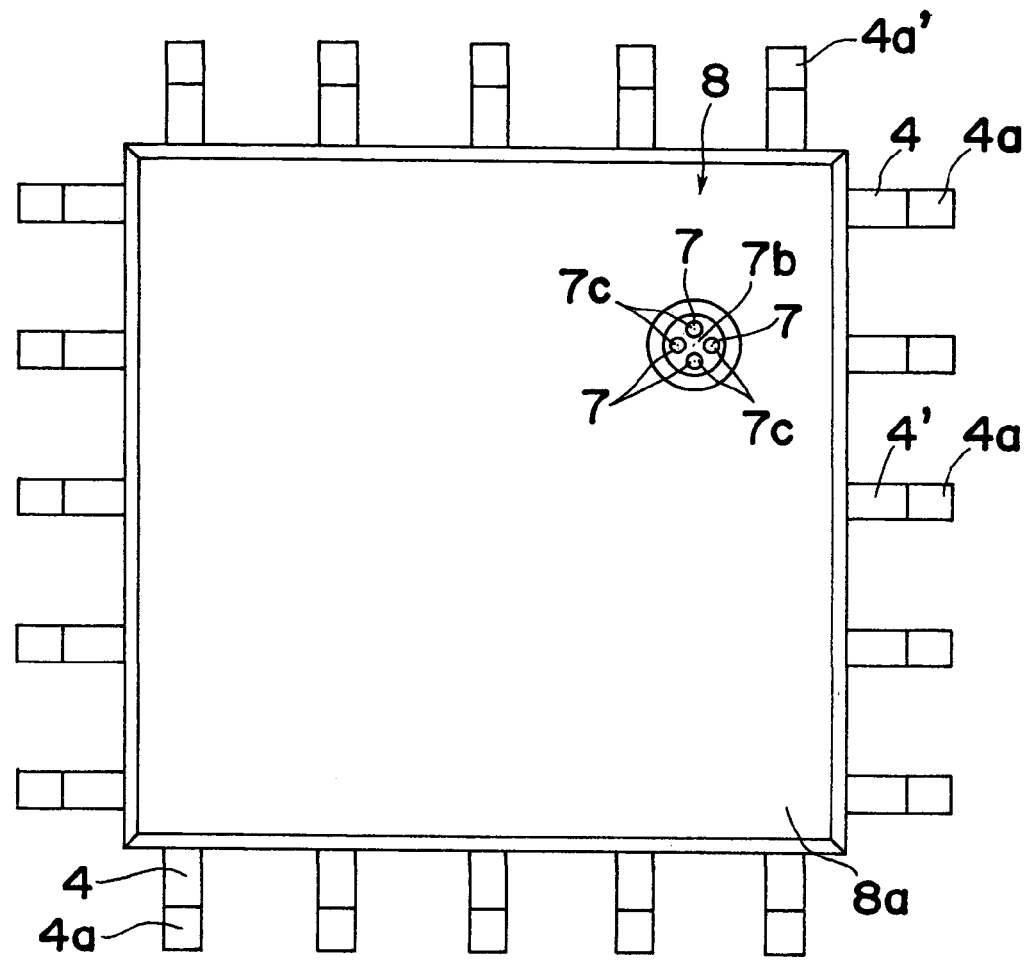
FIG. 13 is a top plan view of a sensor unit according to a sixth embodiment of the present invention.
Figure 14:
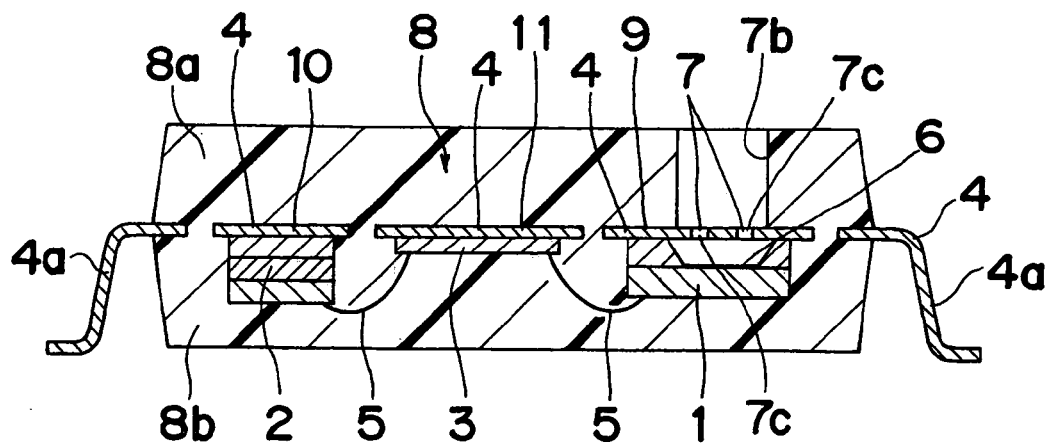
FIG. 14 is a vertical sectional view of the sensor unit in FIG. 13.

With reference to FIGS. 13 and 14, a sixth embodiment of the present invention will be specifically described below. As shown in FIGS. 13 and 14, in a sensor unit according to the sixth embodiment, a pressure-sensor mounting portion 9 of a lead 4 is formed with four small-diameter channels 7c for transmitting an external pressure to a pressure-receiving portion 6. Thus, these small-diameter channels 7c and a through-hole 7b formed in an upper molded body 8b define four pressure-introducing passages 7. The remaining structures are the same as those in the second embodiment, and their description will be omitted.

In the sensor unit according to the sixth embodiment, the four small-diameter channels 7c or pressure-introducing passages 7 each having a small diameter can prevent foreign matter, such as foreign particles or dusts, from getting into a pressure sensor 1 through the pressure-introducing passages 7. In addition, even if an excessive pressure is introduced into the through-hole 7b, the four pressure-introducing passages 7 each having a small diameter reduces the shock due to the pressure. This can prevent breakage of the pressure sensor due to the excessive pressure.

While the sensor unit according to the sixth embodiment has four of the small-diameter channels 7c or pressure-introducing passages 7, the number of the small-diameter channels 7c is not limited to four. That is, any plural number of small-diameter channels 7c or pressure-introducing passages 7 may be formed to obtain the same effect. Further, a plurality of pressure-introducing passages 7 may be defined by combining a plurality of small-diameter channels 7c with a plurality of independent through-holes 7b-formed relative to the respective small-diameter channels 7c. The above characteristic structure in the sensor unit according to the sixth embodiment may be applied to the aforementioned fifth embodiment.

SEVENTH EMBODIMENT

Figure 15:
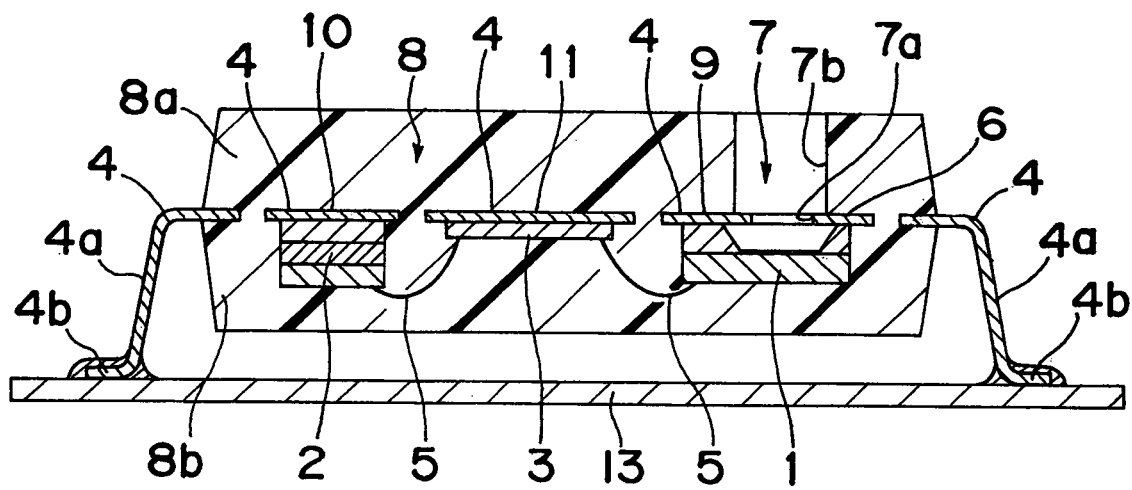
FIG. 15 is a vertical sectional view of a sensor unit according to a seventh embodiment of the present invention.

With reference to FIG. 15, a seventh embodiment of the present invention will be specifically described below. As shown in FIG. 15, in a sensor unit according to the seventh embodiment, each of a plurality of lead terminals 4a has an edge formed as a joint surface 4b to be soldered to a circuit board 13 consisting of a printed board. The joint surface 4b and the bottom surface of a molded body 8 are spaced apart from one another by a given distance vertically (in the thickness direction of the molded body 8). The joint surface 4b is formed by bending the lead terminal 4a in a direction parallel to the side surface of the molded body 8 and then bending the edge of the bended lead terminal 4a outward relative to the molded body 8 and in a direction parallel to the bottom surface of the molded body 8. Each of the joint surfaces 4a is joined to the circuit board 13 through soldering. The remaining structures are the same as those in the second embodiment, and their description will be omitted.

In the sensor unit according to the seventh embodiment, each of the joint surfaces 4a is formed to have a given distance relative to the bottom surface of the molded body 8. This prevents the contact between a lower molded body 8b and the circuit board 13 during an operation of joining the sensor unit to the circuit board 13. That is, only the joint surfaces 4b are brought into contact with and soldered to the circuit board 13. Thus, even if the circuit board 13 is deformed, adverse affects due to the deformation can be suppressed. The above characteristic structure in the sensor unit according to the seventh embodiment may be applied to each of the aforementioned first to sixth embodiments and an after-mentioned eighth embodiment.

EIGHTH EMBODIMENT

Figure 16:
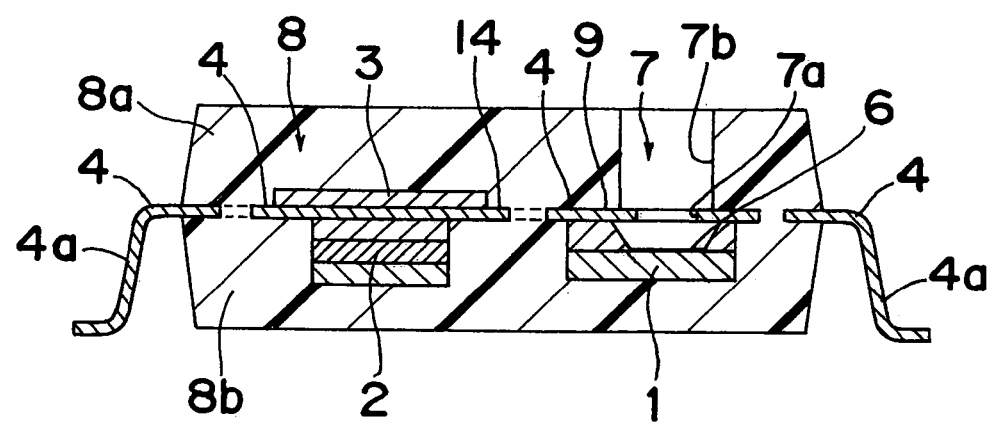
FIG. 16 is a vertical sectional view of a sensor unit according to an eighth embodiment of the present invention.

With reference to FIG. 16, an eighth embodiment of the present invention will be specifically described below. As shown in FIG. 16, in a sensor unit according to the eighth embodiment, a lead 4 has a pressure-sensor mounting portion 9, and a device mounting portion. 14 formed by integrating an acceleration-sensor mounting portion and a signal-processing-circuit mounting portion. A signal-processing circuit 3 is disposed on the top surface of the device mounting portion 14, and an acceleration sensor 2 is disposed on the bottom surface of the device mounting portion 14. That is, the device mounting portion 14 of the lead 4 is sandwiched between the signal-processing circuit 3 and the acceleration sensor 2. The remaining structures are the same as those in the second embodiment, and their description will be omitted.

In the sensor unit according to the eighth embodiment, the signal-processing circuit 3 and the acceleration sensor 2 are disposed on the top and bottom surfaces of the lead 4, respectively. This allows the sensor unit to be reduced in size. In addition, the lead 4 made of metal, such as iron-nickel alloy, is interposed between the signal-processing circuit 3 and the acceleration sensor 2. Thus, the lead 4 can prevent the acceleration sensor 2 from being adversely affected by noises of the signal-processing circuit 3. The above characteristic structure in the sensor unit according to the eighth embodiment may be applied to each of the aforementioned second to seventh embodiments.

While the present invention has been described in conjunction with specific embodiments thereof, various modifications and alterations will become apparent to those skilled in the art. Therefore, it is intended that the present invention is not limited to the illustrative embodiments herein, but only by the appended claims and their equivalents.

INDUSTRIAL APPLICABILITY

As mentioned above, the sensor unit of the present invention is useful, particularly, to the measurement of a plurality of physical quantities, and suitable for use as a sensor for detecting a plurality of physical quantities, such as a tire-air-pressure sensor for measuring pressure and acceleration.

The invention claimed is:

1. A sensor unit comprising:
   a lead having edge portions formed as lead terminals serving as input/output terminals;
   a plurality of physical-quantity sensors including a pressure sensor and an acceleration sensor, wherein each of said plurality of physical quantity sensors are disposed relative to said lead;
   a signal-processing circuit disposed relative to said lead and adapted to process a signal from each of said physical-quantity sensors;
   a molded body made of a plastic material, and formed to seal said lead, said physical-quantity sensors and said signal-processing circuit in such a manner as to allow said lead terminals to protrude outside said molded body, said molded body comprising a through-hole extending upwardly from a pressure receiving portion of the pressure sensor and allows fluid communication between the outside of the molded body and the pressure receiving portion; and
   wherein said signal-processing circuit is operable, based on the signal from at least one of said plurality of physical-quantity sensors, to control the ON/OFF action of the remaining physical-quantity sensors.

2. The sensor unit according to claim 1, wherein:
   said pressure sensor, said acceleration sensor and said signal-processing circuit are disposed to form a line in the longitudinal direction of said sensor unit;
   said pressure sensor and said acceleration sensor are disposed at respective symmetrical positions with respect to the center of said signal-processing circuit in the longitudinal direction of said sensor unit; and
   each of said pressure sensor and said acceleration sensor has substantially the same height dimension.

3. The sensor unit according to claim 1, further comprising a flexible resin interposed between a lower surface of said acceleration sensor and a surface of said molded body.

4. The sensor unit according to claim 1, wherein said pressure-introducing passage includes a plurality of small-diameter channels.

5. The sensor unit according to claim 1, wherein said molded body is integrally formed with a tubular portion extending continuously from the edge of the opening of said through-hole to the outside of said molded body and having substantially the same inner diameter as that of said through-hole.

6. The sensor unit according to claim 1, wherein said plurality of physical-quantity sensors further include a rotational-angular-velocity sensor.

7. The sensor unit according to claim 1, wherein:
each of said plurality of physical-quantity sensors has substantially the same height dimension; and
said molded body has a portion extending between each of said physical-quantity sensors and an outer surface of said molded body on the side of said physical quantity sensor, and another portion extending between said lead and an outer surface of said molded body on the side of said lead, each of said portions having substantially the same thickness dimension.

8. The sensor unit according to claim 1, wherein said molded body have a portion covering the top-surface side of said lead and another portion covering the bottom-surface side of said lead, said portions being formed to have different tapered shapes from one another so as to allow the respective volumes of said portions to be substantially equalized.

9. The sensor unit according to claim 1, wherein at least one of said plurality of physical-quantity sensors and said signal-processing circuit are disposed, respectively, on the top and bottom surfaces of said lead in such a manner as to sandwich said lead therebetween.

10. A sensor unit comprising:
a lead having edge portions formed as lead terminals serving as input/output terminals;
a plurality of physical-quantity sensors including an acceleration sensor and a rotational angular-velocity sensor, each of said plurality of physical quantity sensors disposed relative to said lead;
a signal-processing circuit disposed relative to said lead and adapted to process a signal from each of said physical-quantity sensors; and
a molded body made of a plastic material, and formed to seal said lead, said physical-quantity sensors and said signal-processing circuit in such a manner as to allow said lead terminals to protrude outside said molded body, wherein said signal-processing circuit is operable, based on the signal from at least one of said plurality of physical-quantity sensors, to control the ON/OFF action of the remaining physical-quantity sensors.

11. A sensor unit comprising:
a lead having edge portions formed as lead terminals serving as input/output terminals;
a plurality of physical-quantity sensors each disposed relative to said lead and adapted to measure a physical quantity;
a signal-processing circuit disposed relative to said lead and adapted to process a signal from each of said physical-quantity sensors;
a molded body made of a plastic material, and formed to seal said lead, said physical-quantity sensors and said signal-processing circuit in such a manner as to allow said lead terminals to protrude outside said molded body, wherein said signal-processing circuit is operable, based on the signal from at least one of said plurality of physical-quantity sensors, to control the ON/OFF action of the remaining physical-quantity sensors, and wherein each of said plurality of physical-quantity sensors has substantially the same height dimension; and
said molded body has a portion extending between each of said physical-quantity sensors and an outer surface of said molded body on the side of said physical quantity sensor, and another portion extending between said lead and an outer surface of said molded body on the side of said lead, each of said portions having substantially the same thickness dimension.

12. A sensor unit comprising:
a lead having edge portions formed as lead terminals serving as input/output terminals;
a plurality of physical-quantity sensors each disposed relative to said lead and adapted to measure a physical quantity;
a signal-processing circuit disposed relative to said lead and adapted to process a signal from each of said physical-quantity sensors; and
a molded body made of a plastic material, and formed to seal said lead, said physical-quantity sensors and said signal-processing circuit in such a manner as to allow said lead terminals to protrude outside said molded body, wherein said signal-processing circuit is operable, based on the signal from at least one of said plurality of physical-quantity sensors, to control the ON/OFF action of the remaining physical-quantity sensors, and wherein said molded body has a portion covering the top-surface side of said lead and another portion covering the bottom-surface side of said lead, said portions being formed to have different tapered shapes from one another so as to allow the respective volumes of said portions to be substantially equalized.

13. A sensor unit comprising:
a lead having edge portions formed as lead terminals serving as input/output terminals;
a plurality of physical-quantity sensors each disposed relative to said lead and adapted to measure a physical quantity;
a signal-processing circuit disposed relative to said lead and adapted to process a signal from each of said physical-quantity sensors; and
a molded body made of a plastic material, and formed to seal said lead, said physical-quantity sensors and said signal-processing circuit in such a manner as to allow said lead terminals to protrude outside said molded body, wherein said signal-processing circuit is operable, based on the signal from at least one of said plurality of physical-quantity sensors, to control the ON/OFF action of the remaining physical-quantity sensors, and wherein at least one of said plurality of physical-quantity sensors and said signal-processing circuit are disposed, respectively, on the top and bottom surfaces of said lead in such a manner as to sandwich said lead therebetween.

* * * * *